United States Patent [19]

Reynolds

[11] Patent Number: 4,670,813
[45] Date of Patent: Jun. 2, 1987

[54] PROGRAMMABLE LAMP PLUG

[75] Inventor: Robert W. Reynolds, Ridgefield, Conn.

[73] Assignee: The Perkin-Elmer Corporation, Norwalk, Conn.

[21] Appl. No.: 802,924

[22] Filed: Nov. 29, 1985

[51] Int. Cl.[4] ............................................. H05K 1/18
[52] U.S. Cl. .................................. 361/395; 174/68.5; 361/104; 361/400; 361/402
[58] Field of Search ............... 361/104, 395, 400, 402, 361/406; 174/68.5

[56] References Cited

U.S. PATENT DOCUMENTS

| | | | |
|---|---|---|---|
| 3,028,659 | 4/1962 | Chow et al. | 174/68.5 |
| 3,378,920 | 4/1968 | Cone | 174/68.5 X |
| 3,441,804 | 4/1969 | Klemmer | 361/402 |
| 3,528,048 | 9/1970 | Kirk | 174/68.5 X |
| 3,548,494 | 12/1970 | Haring | 174/68.5 X |
| 3,898,603 | 8/1975 | Cricchi et al. | 174/68.5 X |
| 3,976,983 | 8/1976 | Moussie | 365/96 |
| 4,394,639 | 7/1983 | McGalliard | 361/104 X |
| 4,471,408 | 9/1984 | Martinez | 361/400 X |
| 4,477,857 | 10/1984 | Crocker | 361/104 X |

FOREIGN PATENT DOCUMENTS

| | | | |
|---|---|---|---|
| 2032187 | 4/1980 | United Kingdom | 361/400 |
| 2109922 | 6/1983 | United Kingdom | 324/73 X |

Primary Examiner—R. R. Kucia
Attorney, Agent, or Firm—Thomas P. Murphy; Edwin T. Grimes; Francis L. Masselle

[57] ABSTRACT

An encodable printed circuit board is provided. The circuit board has a plurality of circuit runs disposed on its surface, each of the circuit runs corresponding to a unique bit in an encoded word. Each of the plurality of circuit runs includes a conductor which has a single necked-down section. This single necked-down section can be burned out with the passage of sufficient current through it.

5 Claims, 4 Drawing Figures

PROGRAMMABLE LAMP PLUG

BACKGROUND OF THE INVENTION

The present invention relates to printed circuit boards and, more specifically, to programmable printed circuit boards which are encoded by selectively burning out circuit runs.

With increasing automation in the field of analytical chemistry, it becomes more important for instrumentation used in such applications to be able to sense not only the characteristics of the sample under examination but also its own operating status, condition and configuration.

The present invention, as described herein, has application where it is desired that an instrument, such as a spectrophotometer, operate with a plurality of lamps; further, that such lamps can be brought into the use position automatically and have the apparatus recognize the type of lamp in the use position. In this way the apparatus can effect automatic internal adjustments, such as grating position and lamp power level, in accordance with the lamp being used. It is a further requirement that such a lamp recognition device be reliable and inexpensive to fabricate.

Prior art devices provide for automatic recognition of a lamp by optically, magnetically or mechanically encoding the lamp with its atomic element and operating current. Such encoding schemes are expensive to assemble to the lamp and have the further drawback of requiring expensive and complex apparati to read the information contained in their respective media.

Prior art devices also have provided lamps wherein an electrical network, integral to the lamp, is read by the spectrophotometer to provide information as to the atomic element of the lamp and its operating current. The electrical circuit is, preferentially, resistive, is unique to each lamp and must be individually fabricated as an integral part of each lamp. Such an approach is inherently inflexible and costly to produce.

It was considered that a small printed circuit (pc) board could be integrated into the lamp plug, such pc board being pre-encoded, prior to assembly, with a code indicative of the lamp to which the plug is attached. By pre-encoding the pc board, the assembly costs are great, since a supply of pc boards for each lamp type has to be stocked, then matched with the proper lamp during assembly.

Alternatively, the plug could be hard-wired with the appropriate code. While this would eliminate the problem of having to stock a large quantity of pc boards, it would result in high assembly costs.

Another possible solution is to provide a pc board wherein certain of the circuit runs are cut during assembly so as to encode the lamp type to provide instrument recognition of its element. Such an approach also leads to high assembly costs.

The present invention overcomes the disadvantages of the foregoing approaches by providing a printed circuit board which is integral with the lamp plug and is quickly, accurately and simply encoded following its assembly with the lamp.

BRIEF DESCRIPTION OF THE INVENTION

The present invention contemplates a pc board which is integral with a lamp plug. The pc board is permanently programmed by passage of current through certain runs to burn through them and leave others intact. Each run is provided with a necked-down portion such that signal current may pass through it without damaging the circuit. If, however, the current is increased sufficiently, the necked-down portion is burned through.

By selectively burning out certain runs and leaving others intact, each plug, hence each lamp, is encoded so as to provide instrument identification of the lamp.

There has thus been outlined rather broadly the more important features of the invention in order that the detailed description thereof that follows may be better appreciated. There are, of course, additional features of the invention that will be described hereinafter and which will form the subject of the claims appended hereto. Those skilled in the art will appreciate that the conception on which the disclosure is based may readily be utilized as a basis for designing other structures for carrying out the several purposes of the invention. It is important, therefore, that the claims be regarded as including such equivalent structures as do not depart from the spirit and scope of the invention.

Specific embodiments of the invention have been chosen for purposes of illustration and description, and are shown in the accompanying drawings, forming a part of the specification.

DETAILED DESCRIPTION OF THE PREFERRED EMBODIMENT

Figure 1:
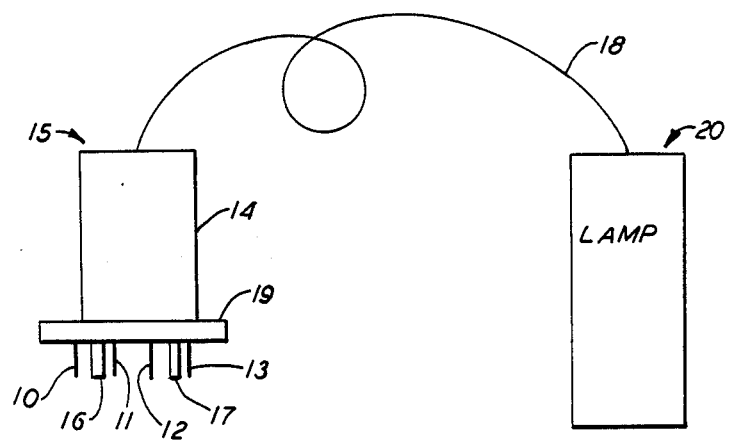
FIG. 1 shows, schematically, a lamp plug attached through a power cable to a lamp.

FIG. 1 shows, in schematic form, a lamp plug 15 attached through a power cable 18 to a lamp 20.

The lamp plug 15 has two principal components, the body 19 and cover 14. The power cable passes through the cover 14 and is connected to the body 19 in a manner described hereinbelow in reference to FIG. 3.

The plug body 19 in turn plugs into a receptacle, not shown, where the plug 15 engages the power and logic circuits of the instrument, to which the plug 15, hence lamp 20, are connected. There are, for example, two power connections, 16 and 17, to the plug body 19 and logic pins, 10–13. As will be more fully explained below, each logic pin is read for one bit of information. It can be understood by those skilled in the art, therefore, by providing more logic pins, longer words can be communicated to the instrument, hence more information.

Figures 2, 3:
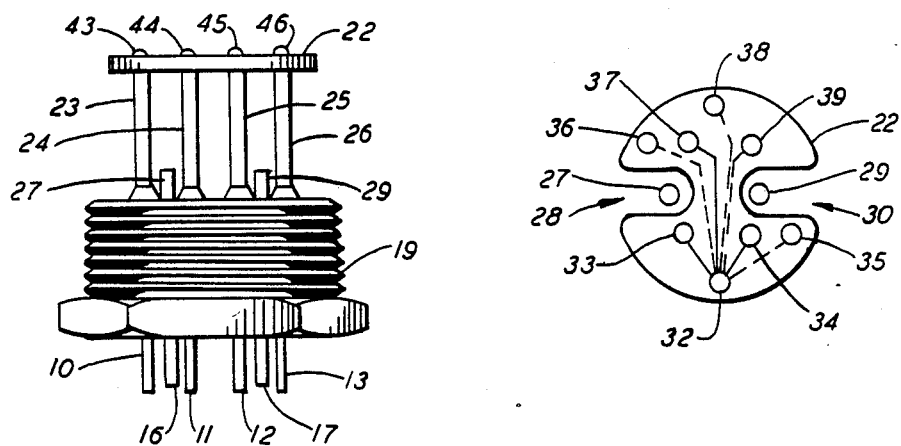
FIG. 2 is a side view of a plug with pc board attached to logic pins.
FIG. 3 is a top view of the pc board of FIG. 2.

Turning now to FIG. 2, one can see the plug body 19 of FIG. 1 with the cover 14 removed. Again, protruding from the bottom of the body 19 are the power connections, 16 and 17, and the logic pins, 10–13. Protruding from the top of the body 19 are power terminals 27 and 29. To the power terminals 27 and 29 is connected the power cable 18 of FIG. 1 which conducts the power that energizes the lamp 20. It can be understood by those skilled in the art that for some applications, power is transmitted to the lamp through means other than through a power cable. This is the case for an electrodeless discharge lamp. In these cases the power cord 18 is replaced by a dummy cord which serves only to tie the lamp plug 15 to the lamp 20 which it identifies.

Also protruding from the top of the plug body 19 are pins 24–26. These pins 24–26 are in electrical communication with logic pins 10–13, respectively. Pins 24–26 are joined to pc board 22 through, for example, soldered connections 43–46, respectively.

FIG. 3 shows the top view of the pc board 22 of FIG. 2. There are two cut-out portions, 28 and 30, through which the two power leads from power cable 18 are threaded to be joined to the power terminals, 27 and 29, respectively.

FIG. 3 also shows, in schematic form, the logic circuit disposed on the pc board 22. In the form illustrated there are seven conductors, 33–39, each of which is tied to a common ground point 32. Three conductors, 32–33, 32–37 and 32–34, are shown in solid line indicating that they are on top of the pc board. Four conductors, 32–36, 32–38, 32–39 and 32–35, are shown in dashed line indicating tha they are on the underside of the pc board. By so placing several of the conductors on the top and several on the bottom of the pc board 22, proper spacing between the conductors can be obtained.

Figure 4:
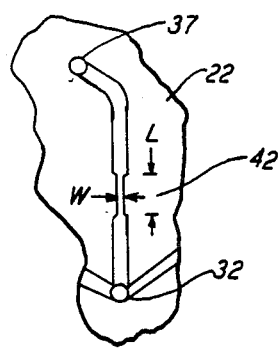
FIG. 4 is an enlarged view of one of the circuit runs on the pc board of FIG. 3.

Referring now to FIG. 4, conductor 32–37 is shown in plan view and is exemplative of the remainder of the conductors shown in FIG. 3. Shown is a necked-down region 42. It is in this necked-down region that a predictable "open-circuit" condition can be burned out a manner hereinbelow described.

The necked-down portion 42 has a length 'L' and width 'W'. By passing a sufficient current through the conductor 32–37 the necked-down portion 42 will burn open while leaving the remainder of the conductor 32–37 intact. Due to the fact that the burned-open gap will be as long as the width 'W' of the necked-down portion 42, the length 'L' of the necked-down portion 42 must be fabricated such that it is at least as long as the width.

In one specific embodiment one ounce copper, having a thickness of 0.0014 in., was used as the conductor 32–37. The overall width of the conductor 32–37 is 0.015 in. while the width, 'W', of the necked-down portion 42 is 0.010 in. The length, 'L', of the necked-down portion 42 is therefore at least 0.010 in. Passage of an impulse current of 20 amps through the conductor is sufficient to burn out the necked-down portion 42 while leaving the remainder of the conductor 32–37 intact.

It should be noted that each conductor selected for burn-open be burned open with an impulse or instantaneous current rather than a ramped current. This avoids charring of the pc board. Further, printed metallic strip conductors are preferred to re-flowed solder conductors. This is due to the fact that burned-open re-flowed solder conductors leave a trail of small solder balls in the burned-open gap. This trail of solder balls can, through dendritic re-connection, cause re-connection of a burned-open gap under certain time and temperature conditions.

The coding of the lamp plug 15 of FIG. 1 can now be explained.

After the lamp plug 15 is assembled to a lamp 20 through a power cord 18, the lamp plug 15 is plugged into a plug burn-in apparatus, not shown. The operator of the burn-in apparatus then selects the code corresponding to the lamp attached to the plug being encoded and causes the burn-in apparatus to burn this encoded word into the circuit on the pc board 22. The burn-in apparatus does this by passing sufficiently high current through selected circuits while not through others. Thus when the programmed plug is plugged into the instrument, the instrument will 'read' the encoded word comprised of open and closed circuits and will thus be able to identify to which lamp the instrument is attached. The instrument can then adjust its salient parameters accordingly to accommodate the requirements and attributes of the lamp it has identified.

There has thus been identified a programmable printed circuit board with specific application in the automatic identification of a lamp in use in an analytical instrument. Such a pc board can easily, quickly and inexpensively be fabricated and programmed to identify any number of lamps desired.

Other modifications of the present invention are possible in light of the above description which should not be deemed as limiting the invention beyond those limitations contained in the claims which follow.

What is claimed is:

1. An encodable lamp plug comprising:
   a lamp plug body;
   a lamp;
   means to attach said lamp plug body to said lamp;
   a plurality of logic pins and one ground pin extending through said lamp plug body;
   a printed circuit board attached to said plurality of logic pins and said one ground pin;
   said printed circuit board having a plurality of circuit runs disposed thereon, each of said plurality of circuit runs corresponding to a unique bit in an encoded word;
   each of said plurality of circuit runs being in electrical communication between said one ground pin and single one of said plurality of logic pins;
   each of said circuit runs including a single necked-down section capable of being selectively burned out by the passage of sufficient current through said single necked-down section to form a gap therein.

2. An encodable lamp plug as claimed in claim 1 wherein:
   selected ones of said single necked-down sections in said plurality of circuit runs is burned out to encode said printed circuit board with a unique encoded word indicative of said lamp.

3. An encodable lamp plug as claimed in claim 2 further comprising:
   power-pins extending through said body;
   said means to attach said body to said lamp including power conductors;
   said power conductors being in electrical communication with said lamp at one end thereof and said power pins at the other end thereof.

4. An encodable lamp plug as claimed in claim 2 wherein said circuit runs are made of copper.

5. An encodable lamp plug as claimed in claim 2 wherein said necked-down section is at least as long as it is wide.

* * * * *